United States Patent
Suwa et al.

(10) Patent No.: US 7,872,254 B2
(45) Date of Patent: Jan. 18, 2011

(54) WIRING AND ORGANIC TRANSISTOR, AND MANUFACTURING METHOD THEREOF

(75) Inventors: Yuji Suwa, Kokubunji (JP); Tomihiro Hashizume, Hatoyama (JP); Masaaki Fujimori, Hatoyama (JP)

(73) Assignee: Hitachi, Ltd., Tokyo (JP)

( * ) Notice: Subject to any disclaimer, the term of this patent is extended or adjusted under 35 U.S.C. 154(b) by 676 days.

(21) Appl. No.: 11/687,767

(22) Filed: Mar. 19, 2007

(65) Prior Publication Data

US 2007/0275500 A1   Nov. 29, 2007

(30) Foreign Application Priority Data

May 12, 2006   (JP) .............. 2006-133585

(51) Int. Cl.
*H01L 29/08* (2006.01)
*H01L 35/24* (2006.01)
*H01L 51/00* (2006.01)

(52) U.S. Cl. ............ 257/40; 257/E25.008; 257/E51.018
(58) Field of Classification Search .................... 257/40, 257/E51.018, E25.008
See application file for complete search history.

(56) References Cited

U.S. PATENT DOCUMENTS

| | | | | |
|---|---|---|---|---|
| 3,637,378 | A * | 1/1972 | Hallman et al. | 430/297 |
| 6,963,080 | B2 * | 11/2005 | Afzali-Ardakani et al. | 257/40 |
| 7,285,440 | B2 * | 10/2007 | Dimitrakopoulos et al. | 438/99 |
| 7,425,474 | B2 * | 9/2008 | Kawase et al. | 438/151 |
| 2006/0216853 | A1 * | 9/2006 | Nomoto | 438/99 |
| 2007/0187674 | A1 * | 8/2007 | Nakamura et al. | 257/40 |

OTHER PUBLICATIONS

V.Sundar, et al., "Elastomeric Transistor Stamps: Reversible Probing of Charge Transport in Organic Crystals" Science, vol. 303, 1644 (Mar. 2004).
O. Jurchescu, et al. "Effect of Impurities on the Mobility of Single Crystal Pentacene" Applied Physics Letters, vol. 84, pp. 3061 (Apr. 2004).
A. R. Brown, et al., "Precursor Route Pentacene Metal-Insulator-Semiconductor Field-Effect Transistors" Journal of Applied Physics, 79, p. 2136 (Feb. 1996).
A. Afzali, et al., "High-Performance, Solution-Processed Organic Thin Film Transistors from a Novel Pentacene Precursor" Journal of American Chemical Society, 124, p. 8812 (Apr. 2002).
T. Minakata, et al., "Direct Formation of Pentacene Thin Films By Solution Process" Synthetic Metals, 153, p. 1-4 (2005).
M. Nagano, et al., "The First Observation of $^1$H-NMR Spectrum of Pentacene" Japanese Journal of Applied Physics, 43, p. L315 (Feb. 2004).

* cited by examiner

*Primary Examiner*—Asok K Sarkar
(74) *Attorney, Agent, or Firm*—Antonelli, Terry, Stout & Kraus, LLP.

(57) ABSTRACT

An organic transistor is formed with a low material cost and low manufacturing cost while still providing high performance and a low contact resistance with an organic semiconductor of the transistor. The organic transistor has electrodes whose bodies are formed mainly of an inexpensive first metal and whose surfaces are formed of a second metal that is expensive but provides high performance properties. To obtain stability of this structure with a low cost, a property of the second metal is used in which the second metal is easily segregated on the surface of the first metal in an alloy of the first metal and the second metal.

8 Claims, 8 Drawing Sheets

WIRING AND ORGANIC TRANSISTOR, AND MANUFACTURING METHOD THEREOF

CLAIM OF PRIORITY

The present application claims priority from Japanese application JP2006-133585, filed on May 12, 2006, the content of which is hereby incorporated by reference into this application.

BACKGROUND OF THE INVENTION

1. Field of the Invention

The present invention relates to wiring and an organic field effect transistor (FET), which are formed using a printing technique, and a method of manufacturing the same.

2. Description of the Related Art

A thin display device uses a liquid crystal or an organic electro luminescence (EL) element. In the thin display device, thin film transistors (TFTs) are used as elements driving pixels. The TFTs each use amorphous silicon or polycrystalline silicon as a channel. Meanwhile, in order to improve flexibility and reduce the manufacturing cost, studies have been extensively made on a display device using organic EL elements as pixels for the purpose of forming a TFT (used for a driving circuit) using an organic material. TFTs using amorphous silicon or polycrystalline silicon have poor flexibility. Thus, display devices with such TFTs also have poor flexibility. In addition, a vacuum facility is used in the manufacturing process for the TFTs, which increases the manufacturing cost. However, if a TFT can be formed using an organic material, this makes it possible to achieve a display device with high flexibility. Furthermore, depending on the type of organic material used, the TFT formed using the organic material can be manufactured by a wet process such as a printing technique. This method does not require a vacuum facility for manufacturing the TFT, which reduces the manufacturing cost.

Organic molecules are mainly divided into two categories: organic molecules with low molecular weight such as a monomer and oligomer; and organic molecules with high molecular weight, which are categorized as polymers. TFTs having a channel composed of organic molecules (which is an organic TFT) are also mainly divided into two types depending on which type of molecules is used to form a channel: an organic TFT with a channel composed of a monomer or the like; and an organic TFT with a channel composed of a polymer. In the case of the organic TFT with a channel composed of a monomer or the like, it has been demonstrated that the mobility of carriers flowing in the channel is increased to a similar level to the mobility of carriers in amorphous silicon when the organic molecules maintain good crystalline properties. Thus, it is relatively easy to achieve an organic TFT with a high operation speed. It is difficult, however, to reduce the manufacturing cost since a molecular beam epitaxy method is generally used for organic molecules to form a channel. In contrast, it is easy to apply a wet process to an organic TFT with a channel composed of a polymer, which reduces the manufacturing cost. However, the mobility of carriers flowing in the channel composed of a polymer is approximately one tenth that in the organic TFT with a channel composed of a monomer or the like. Therefore, the organic TFT with a channel composed of a polymer provides low performance.

In general, there is a problem in that the operation speed of a TFT with a channel composed of organic molecules is lower than that of silicon-based TFT. This is because the mobility of carriers flowing in the channel composed of organic molecules is low. It is known that one of the main reasons is the scattering of carriers in the channel. For a monomer or the like, in order to reduce the carrier scattering, the following method is used in many cases: the size of grains in a crystal forming a channel is increased so as to reduce the number of grain boundaries through which carriers flow between electrodes disposed at both ends of the channel. This reduces carrier scattering. The use of a single crystal for a channel is most desirable since the effect of the grain boundaries can be reduced. In the case of a channel composed of a polymer, if a polymer is extended to a maximum extent in a direction parallel to the flow of carriers in a channel, the carrier scattering in the polymer is reduced in general.

To realize a display device with high flexibility, a peripheral circuit driving pixels also requires high flexibility. TFTs used in a circuit driving pixels require carrier mobility of about 10 $cm^2/Vs$. Currently, however, only a TFT with a channel composed of organic molecules with low molecular weight has been demonstrated to meet the above requirement. For example, Non-Patent Document 1 (Science, 303, 1644 (2004)) describes that carrier mobility of 15 $cm^2/Vs$ is obtained in an organic TFT with a channel composed of a single crystal of rubrene molecules. Non-Patent Document 2 (Applied Physics Letters, 84, 3061 (2004)) discloses that carrier mobility of 35 $cm^2/Vs$ is achieved for a single crystal of highly-purified pentacene molecules at a room temperature. Such high carrier mobility, however, can be obtained for a single crystal sample by paying special attention to the manufacturing of the single crystal or TFT sample. When a monomer or the like is used to form a channel, a thin film crystal of organic molecules, which is formed by the molecular beam epitaxy method, is more generally used. In this case, it is difficult to form a single crystal for the channel. In addition, a vacuum apparatus is required, which causes disadvantages in cost and mass productivity.

Such organic TFTs pose problems that the following two types of requirements cannot be satisfied simultaneously: performance required for application; and manufacturing cost and mass productivity required for production profitability. More specifically, the molecular beam epitaxy method is generally used to manufacture an organic TFT including a monomer or the like, which will easily improve the TFT performance. In this case, there are disadvantages in the production. On the other hand, it is relatively easy to reduce the manufacturing cost for an organic TFT including a polymer. In this case, since the TFT performance is very low, such a TFT has only limited applications.

To solve the above problems, there is a method in which a monomer or the like is dissolved in a solvent and printed so as to form a semiconductor layer used as a channel. For example, Non-Patent Document 3 (Journal of Applied Physics, 79, 2136 (1996)) describes pentacene molecules, which are a most typical example of organic molecules applied to a TFT including a monomer or the like. In addition, Non-Patent Document 4 (Journal of American Chemical Society, 124, 8812 (2002)) describes a technique for synthesizing derivatives of pentacene molecules to form a thin film using a solution with increased solubility for a solvent. Non-Patent Document 5 (Synthetic Metals, 153, 1 (2005)) discloses a technique for dissolving pentacene molecules directly in a solvent and coating them so as to form a thin film. Furthermore, Non-Patent Document 2 and Non-Patent Document 6 (Japanese Journal of Applied Physics, 43, L315 (2004) describe a technique for dissolving pentacene molecules in an organic solvent. Those techniques make it possible to form an organic film composed of a monomer or the like by printing without using a vacuum apparatus, which increases the possibility of achieving a TFT formed with required performance and low cost.

In order to form an organic TFT by printing with a low cost, it is desirable that an organic semiconductor, wiring and electrodes formed with metal lines be formed by printing. To form the above, the metal is made into particles. Then, the particles are covered with an organic material and the like so as to have solubility to a solvent. The dissolved particles are turned into metal ink or paste and diffused to specified locations by printing. Then, the organic material is removed by a treatment at a required temperature to form the metal wiring and electrodes. The method of forming wiring with silver or gold paste by printing has been established.

SUMMARY OF THE INVENTION

It is known that a Schottky barrier is generated at a boundary between a semiconductor and metal and functions as a contact resistance when a current flows. The size of the barrier varies depending on a relative relationship between a Fermi level of the metal and a level of a band of the semiconductor in which carriers are doped. Reduction of a contact resistance with an electrode is more important problem in an organic semiconductor having low carrier mobility than that in an inorganic semiconductor such as silicon.

The dopant concentration in a semiconductor such as silicon around the boundary with metal can be controlled to shift the electronic state in the semiconductor toward the Fermi level of the metal, in order to reduce the Schottky barrier. In this case, an ion implantation method is used to control the spatial distribution of the dopant concentration. However, implanting ions into an organic semiconductor may damage the molecule structure to an extent that it cannot be recovered. The fact that this method requires high cost spoils the advantage of a printing type organic transistor that it can be manufactured with a low cost.

Pentacene is known as one of organic semiconductors in which high carrier mobility is obtained. In the case of pentacene, it is known that gold is able to maintain the lowest contact resistance as an electrode material used with pentacene. If all the wiring and electrodes are formed of gold, however, the FET would be expensive because gold is expensive as a material thereof. In contrast, the wiring and electrodes can be formed of copper with a low cost. In this case, however, the Schottky barrier is large so as to increase the contact resistance with the semiconductor, which makes it impossible to obtain sufficient performance.

Considering the case of a combination with an organic semiconductor other than pentacene, the type of metal material used as an electrode depends on the type of organic semiconductor material in order to obtain the lowest contact resistance. Many organic materials have similar electronic states to that of pentacene at least with respect to valence bands and conduction bands. Thus, gold may be the most suitable metal material for electrodes. Therefore, even if an organic semiconductor other than pentacene is used, formation of a printing type organic FET poses similar challenges, that is, performance such as a low contact resistance, manufacturing cost, material cost, stability (corrosion resistance) and the like. There may be no metal material simultaneously satisfying the abovementioned multiple requirements, which is used as an electrode.

The present invention provides a printing type organic transistor and a method of manufacturing the same, which meet the abovementioned requirements simultaneously and provide sufficient performance with a low cost.

The present invention uses two types of metal materials as electrode materials in order to solve the abovementioned problems. To satisfy the two requirements of the cost and performance, which are contradictory to each other, for example, a combination of first metal (material) with second metal (material) is used. The first metal is inexpensive and does not have sufficient performance, while the second metal is expensive and has sufficient performance. Wiring formed on the entire device basically uses the first metal. A thin film of the second metal is disposed on the entire surface of the wiring or at least on the contact boundary of an electrode between an organic semiconductor and the electrode. With this structure, most part of the wiring and electrodes is formed with a low cost, while the performance can be sufficiently ensured since the contact region which is important for the performance is formed of the high-performance material.

It is required that a method of manufacturing such a structure be inexpensive. To manufacture such a structure with a low cost, the second metal is precipitated on the surface of the electrode from an alloy of the two types of metal by surface segregation so as to form a thin film of the second metal on the electrode surface. The alloy described above is formed after the two types of metal are dissolved. Atoms of the two types of metal may be randomly scattered. The materials are not required to have atoms with a fixed atom arrangement pattern.

To promote the surface segregation, a heat treatment is performed at a predetermined temperature. In addition to the heat treatment, there is another method in which a third material (formed mainly of non-metal) is adsorbed onto the electrode surface so as to enhance the effect of further promoting the surface segregation. Furthermore, there is another method in which after the electrodes are formed only of the first metal, the thin film formed of the second metal is disposed on the surface.

The first metal is required to be inexpensive. Also, it is necessary that the electrodes be easily formed of the first metal. The first metal desirably has a low resistivity and high corrosion resistance. However, this is not essential. Specifically, Ag, Cu, Fe, Al, Ni, or the like can be regarded as a candidate for the electrode material.

It is assumed that pentacene or a material having an electronic state similar to that of pentacene is used as an organic semiconductor. With the assumption, a candidate for the second metal may be a material in which the contact resistance with the organic semiconductor is lower as the electronegativity is higher. Thus, the following materials are expected: Au, W, Pb, Pt, Rh, Pd, Ir, Ru, Os, Mo, etc. Among the above materials, Pb (lead) is inexpensive as the material and can be expected to have high performance. However, Pb is required to be carefully handled due to its toxicological properties although it can be independently used as an electrode.

When the surface segregation is used to form the electrodes, the combination of the first metal and the second metal must be used so that the second metal is segregated on the electrode surface. Of the above candidate materials, there are the following combinations in which desirable surface segregation actually occurs: combination of Cu and Au; combination of Ni and Au; and combination of Ni and Pb. Especially, the combination of Cu and Au is desirable for the following reasons: copper is inexpensive and used for a silicon device; it has been proven that the contact resistance between gold and pentacene is relatively low; and gold is excellent in corrosion resistance.

The present invention allows the wiring and electrodes in a transistor to be manufactured with a low cost, and provide a low contact resistance with the semiconductor and high performance such as high corrosion resistance. It is most important that an organic transistor formed by printing be mass-manufactured with a low cost. The present invention can be incorporated in a series of the printing processes so that the organic transistor is formed to provide high performance with a low cost.

DETAILED DESCRIPTION OF THE PREFERRED EMBODIMENTS

First Embodiment

A description will be made of a method of manufacturing an organic transistor with high performance and a low cost. Such an organic transistor can be achieved by using pentacene as an organic semiconductor and forming an electrode of an alloy of gold and copper in a first embodiment of the present invention.

Gold has a relatively low contact resistance with pentacene. Also, gold is most excellent in performance as an electrode material with respect to a combination with pentacene. There is a problem, however, in that gold is expensive. On the other hand, copper has a relatively high contact resistance with pentacene. This characteristic of copper is not preferable. However, copper has advantages in that it is much more inexpensive than gold and has been used as a material for wiring and electrodes formed in silicon devices. From the view point of stability and corrosion resistance of a device structure in the air, copper is not so unstable. However, gold is excellent in chemical reaction resistance and stability. To use only the advantages of both gold and copper, a structure is formed in which wiring and electrodes formed mainly of copper (first metal) are covered with a thin film of gold (second metal). In order to form the above structure at a low cost, using an alloy formed by mixing gold and copper, an electrode is formed by printing. Then, the printed electrode is subjected to a heat treatment at an appropriate temperature so that gold atoms are segregated on the electrode surface.

Figure 1A:
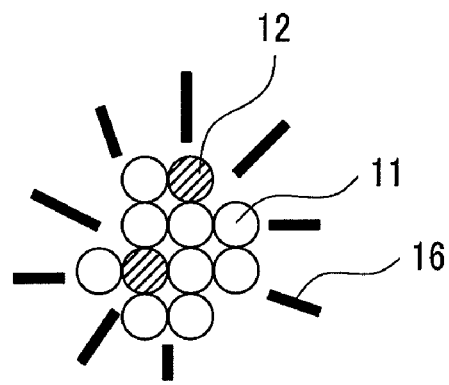
FIG. 1A is a view showing a particle of an alloy in which copper atoms 11 and gold atoms 12 are randomly scattered, the particle being covered with an organic material 16 so as to allow the particle to be dissolved in a solvent.

FIG. 1A is a view showing a particle of an alloy in which copper atoms 11 and gold atoms 12 are randomly scattered, the particle being covered with an organic material 16 so as to allow the particle to be dissolved in a solvent. A method of covering fine metal particles with an organic material to increase solubility is typically used to form metal ink or paste. The ratio of the number of the gold atoms 12 to the number of the copper atoms 11 ranges from about 0.2 to about 0.01.

The smaller the ratio of the number of the gold atoms 12 to the number of the copper atoms 11 is, the more the material cost is reduced. If the ratio is too small, the density of the gold atoms 12 is not sufficient on the surface even if the gold atoms are segregated on the surface of the copper atoms 11 after formation of the electrode, so that a reduction in contact resistance and improvement in corrosion resistance cannot be sufficiently obtained. Therefore, it is ideal that the ratio of the number of the gold atoms 12 to the number of the copper atoms 11 is reduced in a range in which sufficient performance is obtained. The optimum ratio depends on the relationship between a volume and a surface area of the electrode. The volume of the electrode is proportional to the number n of atoms to the third power, whereas the surface area of the electrode is proportional to the number n of atoms to the second power. Hence, the smaller the volume of the electrode is, the larger the ratio of the number of the gold atoms 12 (to the number of the copper atoms 11) required for covering the surface is. However, the above proportional expressions are not accurately established since it is not ensured that all the gold atoms 12 included in the alloy can be segregated on the surface of the copper atoms 11. Therefore, the optimum ratio varies depending on the detailed structure and size of the organic FET.

Figure 1B:
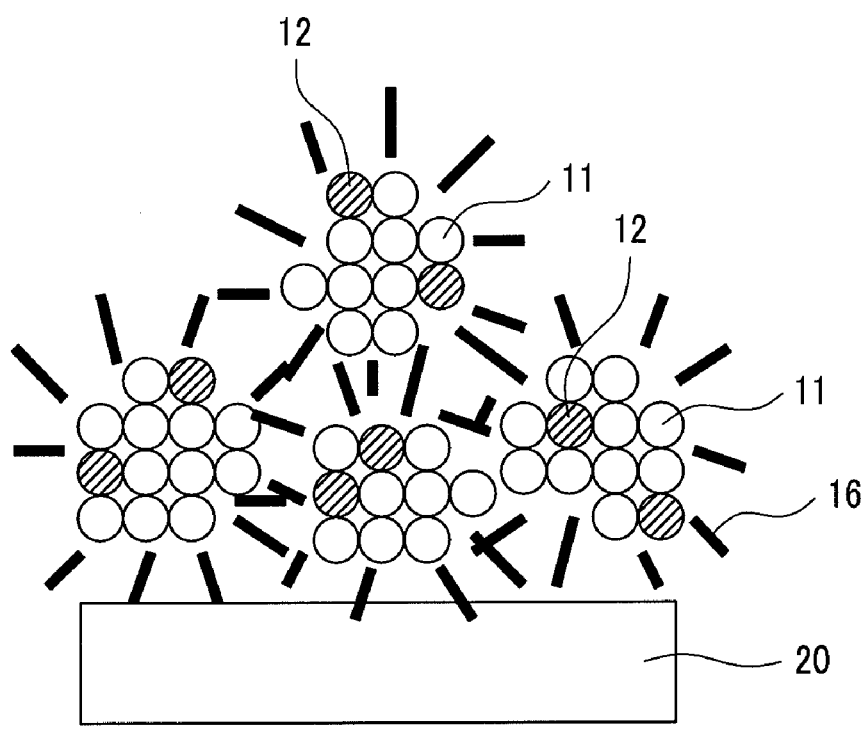
FIG. 1B is a view showing a state after metal ink of the particles of the alloy is printed on a substrate and the solvent is evaporated.

FIG. 1B is a view showing a state after metal ink of the particles of the alloy is printed on a substrate 20 of glass, polyimide, or the like, and a solvent is evaporated. Since the particles are covered with the organic material, the entire deposited materials formed on the substrate 20 are not in a metallic state.

Figure 2A:
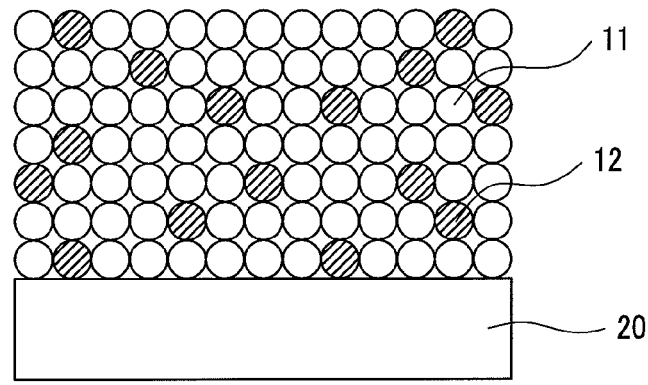
FIG. 2A is a cross sectional view showing a state where a structure shown in FIG. 1B is subjected to a heat treatment for about one hour at a predetermined temperature ranging from 50° C. to 300° C. so that organic molecules are burned and removed to leave only the metal.

FIG. 2A is a cross sectional view showing a state where a structure shown in FIG. 1B is subjected to a heat treatment for about one hour at a predetermined temperature ranging from 50° C. to 300° C. so that organic molecules are burned and removed to leave only the metal. The copper atoms 11 and the gold atoms 12 are randomly scattered. In FIG. 2A, it is assumed that only organic materials 16 are removed and the gold atoms 12 are not segregated on the surface (the surface segregation will be described later). When the above two processes (removal and surface segregation) are simultaneously performed by a single heat treatment, the structure shown in FIG. 2A may not be formed.

Figure 2B:
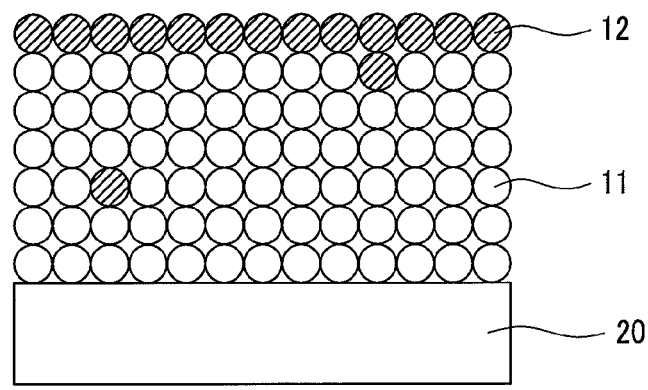
FIG. 2B is a cross sectional view showing a state where the gold atoms are segregated by a heat treatment at a relatively higher temperature than the temperature during the heat treatment shown in FIG. 2A so that the surface of the copper atoms 11 is covered with one atom layer of the gold atoms 12.

FIG. 2B is a cross sectional view showing a state where the gold atoms are segregated by a heat treatment at a relatively higher temperature than the temperature during the heat treatment shown in FIG. 2A so that the surface is covered with one atom layer of the gold atoms 12. When some of the gold atoms 12 are left with one atom layer being formed on the surface, the left gold atoms 12 may be randomly scattered in an area of the copper atoms or may be partially accumulated under the one atom layer, as shown in FIG. 2B. The arrangement varies depending on the combination of types of the first metal and the second metal.

When all the atoms in a top most layer of the surface of copper are replaced with gold atoms, the thickness of a thin film of gold to be formed on the surface is regarded as one atom layer. A thickness of 0.5 to 5 atom layers suffices for such a thin film of gold. In order to reduce a contact resistance caused by a Schottky barrier of the copper electrode, it is necessary that the Fermi level of the surface of the electrode is close to that of bulk gold. For this reason, the gold atom layer placed near a boundary with pentacene is required to have a Fermi level close to bulk gold. Preferably, the thin gold film has a thickness to a certain extent. For the reason of short screening length in the electronic state of the metal or other reasons, the thickness of the thin gold film desirably has about five atom layers. The thickness less than five atom layers can also provide the effect of reducing the contact resistance.

The thin gold film, when formed on the surface using the surface segregation, can be easily formed with one atom layer. Whether or not a thin film having a thickness larger than one atom layer can be formed, however, depends on the combination of two types of metal. From the view point of the cost, it is preferable to use a thin film with a thickness reduced to a minimum thickness in which sufficient performance can be provided. The thickness of 0.5 atom layers (which means that the number of gold atoms is the same as the number of copper atoms in the first atom layer) can be expected to improve the performance (to reduce the contact resistance). Therefore, the above thickness is about the minimum level of the thickness of the thin gold film to be formed.

If a temperature during a heat treatment for removing organic molecules placed around fine metal particles of metal ink is lower than a temperature during a heat treatment for promoting the surface segregation, the organic molecules are first removed to obtain the state as shown in FIG. 2A or a similar state thereto. After that, the gold atoms 12 are segregated on the surface of the copper atoms 11 so that the above-mentioned state is changed to the state as shown in FIG. 2B or a similar state thereto. If the temperature during the heat treatment for removing organic molecules is higher than the temperature during the heat treatment for promoting the surface segregation, the removal of organic molecules and the surface segregation simultaneously occur so as to obtain the state as shown in FIG. 2B or a similar state thereto without shifting to the state as shown in FIG. 2A or a similar state thereto. It is not necessary that the state as shown in FIG. 2A be obtained. Thus, irrespective of which temperature is higher than the other between the two heat treatments, if a heat treatment performed at a higher temperature is conducted, it is not necessary that the heat treatment be performed twice.

Figure 2C:
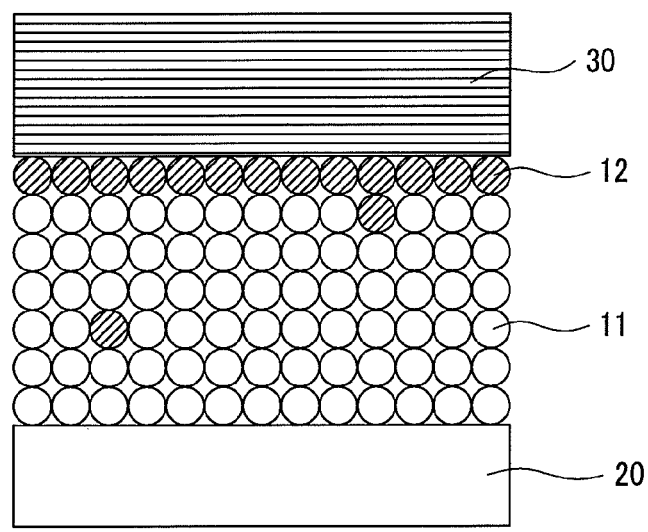
FIG. 2C is a cross sectional view showing a structure in which a pentacene crystal is formed on an electrode having a thin gold film as shown in FIG. 2B.

FIG. 2C is a cross sectional view showing a structure in which a pentacene crystal 30 is formed on the electrode having the thin gold film formed thereon, as described above. This structure has the pentacene crystal 30 formed on the thin gold film covering the copper electrode. Since the pentacene crystal 30 contacts the thin gold film, the contact resistance is lower than that in the case of a copper electrode not having a thin gold film formed thereon.

Figure 3A:
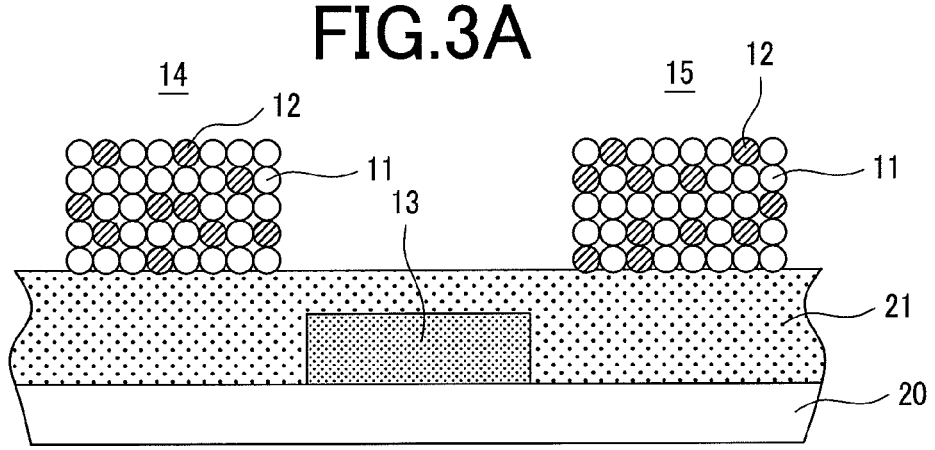
FIG. 3A is a cross sectional view showing a state where a source electrode and a drain electrode for a FET structure are formed by printing with the alloy.
Figure 3B:
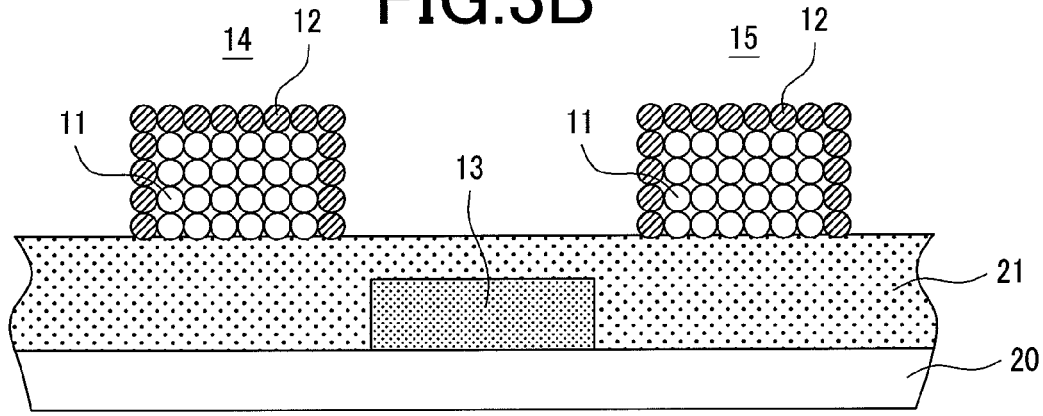
FIG. 3B is a cross sectional view showing a state where gold atoms in the source electrode and the drain electrode are segregated on the surface of the copper atoms by a heat treatment.
Figure 3C:
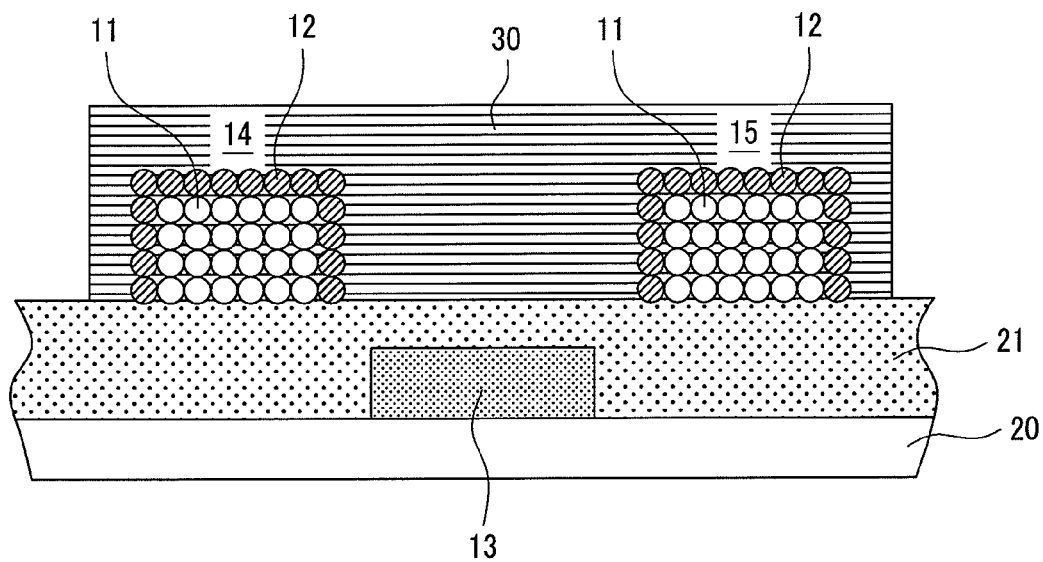
FIG. 3C is a cross sectional view showing the complete FET structure in which an organic semiconductor is formed.

FIGS. 3A to 3C show a process of forming a FET structure in detail. As shown in FIG. 3A, a gate electrode 13 is formed on the substrate 20, and an insulating layer 21 is formed so as to cover the gate electrode 13. The gate electrode 13 is not in direct contact with a semiconductor. Thus, it is not necessary that the method for reducing the contact resistance according to the present invention be applied to the gate electrode 13. It should be noted that the gate electrode 13 may be formed by the method according to the present invention since the method allows the corrosion resistance to be improved with low material cost.

Next, metal ink of the particles of the alloy, in which the copper atoms 11 and the gold atoms 12 are randomly scattered, is printed on the insulating layer 21 so as to form a source electrode 14 and a drain electrode 15, as shown in FIG. 2A. The particles of the alloy are covered with the organic material 16. In the source electrode 14 and the drain electrode 15, the copper atoms 11 and the gold atoms 12 are randomly scattered.

Next, the gold atoms 12 are segregated on the surface of the copper atoms 11 by a heat treatment. As shown in FIG. 3B, the gold atoms 12 cover the surfaces of the source electrode 14 and the drain electrode 15. In such a structure, the source electrode 14 and the drain electrode 15 are formed upward to provide convex shapes. The gold atoms 12 are segregated so as to cover the entire surface. If the metal ink of the coated alloy is subjected to a heat treatment, it is not required that the structure shown in FIG. 3A be formed when the removal of organic molecules covered with the particles of the alloy and the surface segregation of the gold atoms 12 occur simultaneously.

Lastly, pentacene 30 is printed, and a solvent is evaporated to crystallize the pentacene 30. As shown in FIG. 3C, the FET structure is completed. A part of wiring not having the FET structure is not covered with the pentacene 30 (organic semiconductor). In this case, if such an exposed wiring portion is formed by the method according to the present invention, the surface of the exposed wiring portion is covered with gold, resulting in good corrosion resistance.

Figure 4A:
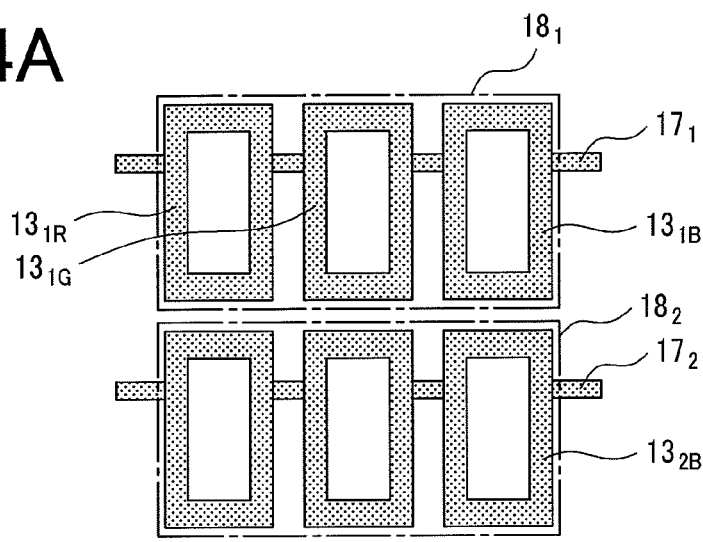
FIG. 4A is a diagram showing a state where a gate electrode pattern is formed on the substrate in order to form a driving circuit for a liquid crystal display using the FET structure according to the present invention.
Figure 4B:
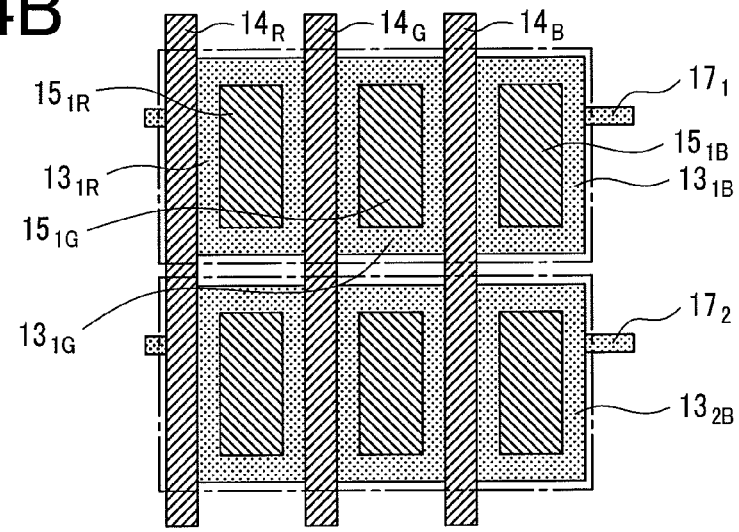
FIG. 4B is a diagram showing a state where the source electrode and the drain electrode are formed using the pattern as shown in FIG. 4A.
Figure 4C:
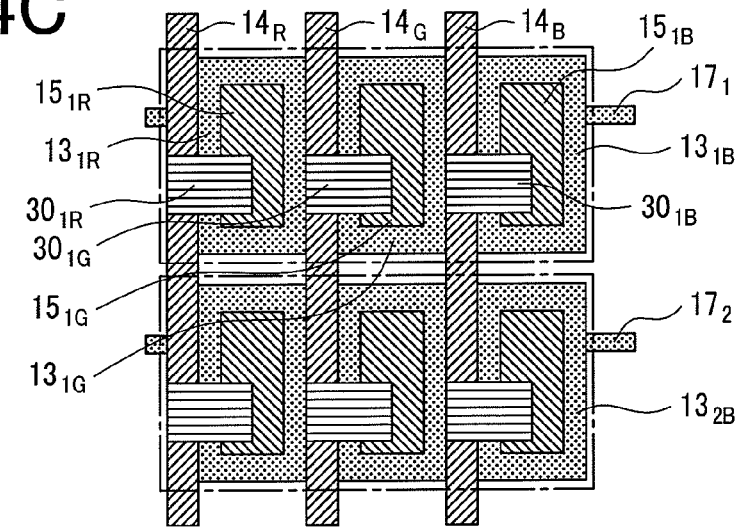
FIG. 4C is a diagram showing a state where pentacene is printed and crystallized at a portion used to form the FET structure.

FIGS. 4A to 4C are plan views showing an example of forming a driving circuit for a liquid crystal display by use of the FET structure according to the present invention. As shown in FIG. 4A, a pattern of the gate electrodes 13 is formed on the substrate. Then, the insulating layer is printed so as to cover the entire pattern. In FIGS. 4A to 4C, the insulating layer is not illustrated for simplicity. The state as shown in FIG. 4A corresponds to the state shown in FIG. 3A after the substrate 20, the gate electrode 13, and the insulating layer 21 are formed. In FIG. 4A, a pixel $18_1$ is composed of three elements of R (red), G (green), and B (blue). The gate electrodes 13 include gate electrodes $13_{1R}$, $13_{1G}$, and $13_{1B}$, corresponding to the pixel 18. Each of the gate electrodes $13_{1R}$, $13_{1G}$, and $13_{1B}$ is connected with a line $17_1$. A pixel $18_2$ has a similar structure to the pixel $18_1$. In the pixel $18_2$, only reference numerals of a line $17_2$ and a gate electrode $13_2$ are shown to avoid complexity in the figure.

Next, the metal ink is printed and is subjected to a heat treatment so as to form source electrodes $14_R$, $14_G$, $14_B$ and drain electrodes $15_R$, $15_G$, $15_B$ on a pattern as shown in FIG. 4B. In this case, each of the source electrodes $14_R$, $14_G$, $14_B$ is provided in common with the pixels $18_1$, $18_2$, . . . , and each of the drain electrodes $15_R$, $15_G$, $15_B$ is provided independently of the pixels $18_1$, $18_2$ . . . . This state corresponds to the state as shown in FIG. 3B.

Lastly, as shown in FIG. 4C, the pentacene 30 is printed and crystallized on a portion to be formed of the FET structure. The pentacene 30 is disposed so as to connect each of the source electrodes $14_R$, $14_G$, $14_B$ (in common with each of the pixels), each of the drain electrodes $15_R$, $15_G$, $15_B$ (independent of each of the pixels), and each of the gate electrodes $13_{1R}$, $13_{1G}$, $13_{1B}$ (independent of each of the pixels), respectively. Also, the pentacene 30 crosses each of the source electrodes $14_R$, $14_G$, $14_B$, each of the drain electrodes $15_R$, $15_G$, $15_B$, and each of the gate electrodes $13_{1R}$, $13_{1G}$, $13_{1B}$, respectively. The cross sectional structure of the portion covered with the pentacene 30 corresponds to that of FIG. 3C.

Furthermore, a liquid crystal layer and a transparent electrode are laminated on the pattern shown in FIG. 4C.

A voltage is successively applied to each of the gate electrodes $13_{1R}$, $13_{1G}$, $13_{1B}$, at a predetermined frequency through the lines $17_1$, $17_2$ . . . used as scanning lines so as to successively activate each of the pixels $18_1$, $18_2$ . . . . Also, a voltage associated with the scanning line is applied to each of the source electrodes $14_R$, $14_G$, $14_B$, which are in common with the pixels. Charges accumulated in a square area of each of the gate electrodes 13 are controlled so as to control to turn on and off the pixels of the liquid crystal display.

Second Embodiment

In a second embodiment, first metal ink and second metal ink are prepared, instead of using ink of particles of an alloy to form an electrode. The two types of ink are mixed and printed so as to form an electrode structure similar to that in the case of using the ink of an alloy. Similarly to the first embodiment, a description will be made of gold atoms 12 and copper atoms 11 as an example.

Figure 5A:
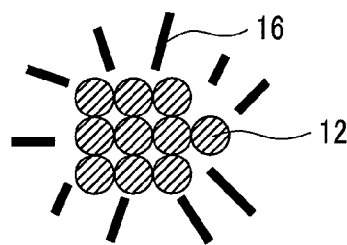
FIG. 5A is a view showing ink of a particle including gold atoms.
Figure 5B:
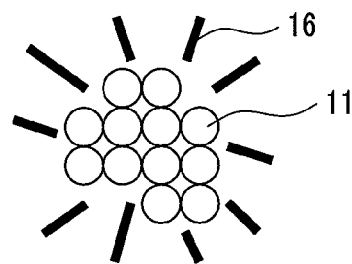
FIG. 5B is a view showing ink of a particle including copper atoms.

FIG. 5A is a view schematically showing a particle including gold atoms 12 covered with an organic material 16. FIG. 5B is a view schematically showing a particle including copper atoms 11 covered with the organic material 16. The particles formed by covering gold atoms 12 with the organic material 16 are dissolved in a solvent so as to form gold ink. The particles formed by covering copper atoms 11 with the organic material 16 are dissolved in a solvent so as to form copper ink. The gold ink and the copper ink are mixed. In this example, the organic material 16 covering the gold atoms 12 and the organic material 16 covering the copper atoms 11 are the same. The organic materials 16, however, may be different from each other. In this case, the organic materials 16 require a common solvent capable of dissolving both types of the particles. In addition, when the two types of ink are mixed, they must scatter to a certain extent without being phase-separated. It is easy to adjust an amount of each type of ink. The percentages of the metal materials required for the final electrode structure may be determined when mixing the two types of metal ink.

Figure 5C:
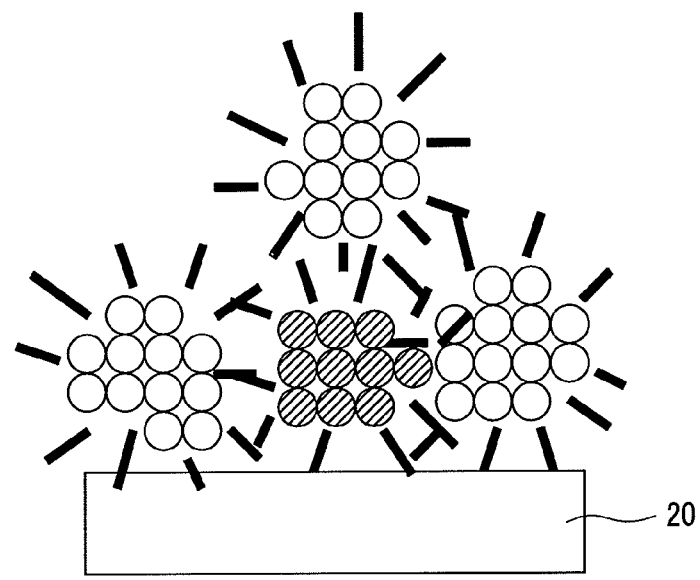
FIG. 5C is a cross sectional view showing a state after the ink of the particles including the gold atoms and the ink of the particles including the copper atoms are mixed and printed, and a solvent is evaporated.

FIG. 5C is a view showing a state where the abovementioned mixed ink is printed on the substrate 20 and the solvent is evaporated. As understood from the comparison with FIG. 1B, there are only two types of a particle formed only of gold atoms 12 and a particle formed only of copper atoms 11 in the second embodiment, whereas each particle includes gold atoms 12 and copper atoms 11 in the first embodiment. In the second embodiment, each amount of the two types of metal ink is adjusted to determine the percentages of the metal materials required for the electrode structure when the two types of metal ink are mixed.

During a heat treatment for removing organic molecules, it is expected that gold atoms are sufficiently diffused and mixed. In the heat treatment, a structure similar to that of FIG. 2A or FIG. 2B can be thus achieved. Subsequently, an organic transistor is formed by a method similar to that in the first embodiment.

Third Embodiment

In a third embodiment, a third material is adsorbed on the electrode surface in addition to the heat treatment, in order to promote the surface segregation of the second metal in the electrode in which the first metal and the second metal are mixed. This allows the surface segregation to be more effective.

Figure 6A:
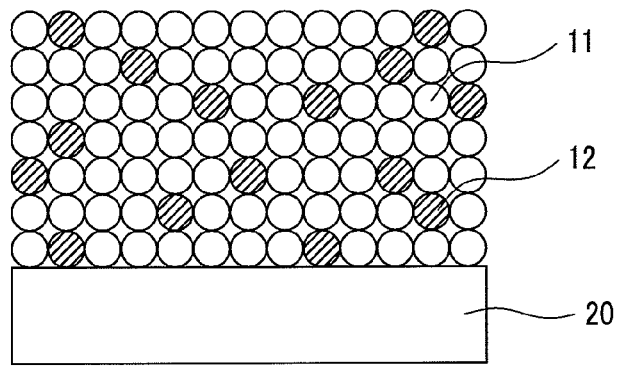
FIG. 6A is a cross sectional view showing an electrode in which gold atoms and copper atoms are mixed.

FIG. 6A shows the same state as that shown in FIG. 2A. FIG. 6A, however, is a cross sectional view showing an electrode in which the surface segregation of the second metal cannot be effected only through the heat treatment for removing organic molecules of the metal ink, and the first metal and the second metal are randomly scattered.

Figure 6B:
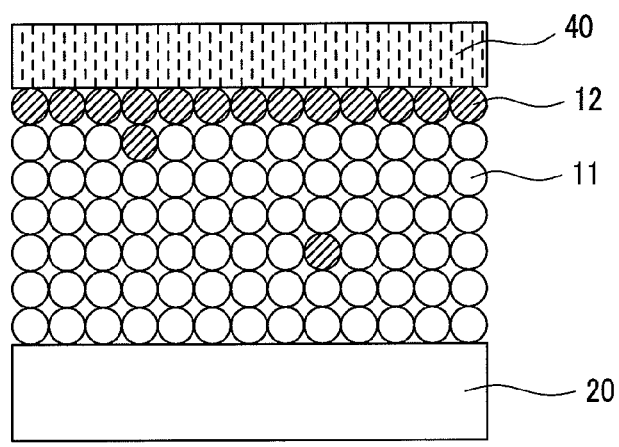
FIG. 6B is a cross sectional view showing a state where a monolayer is adsorbed and the gold atoms are segregated on the surface by performing a heat treatment.

FIG. 6B a cross sectional view showing an electrode in which the third material 40 is adsorbed on the surface of the electrode shown in FIG. 6A. If a foreign material is adsorbed on the surface, the electronic state on the surface may be changed so that the atom arrangement may be changed or that a force applied to the atoms arranged on the surface may be changed. The change differs depending on the combination of the electrode materials (first metal and second metal) with the third material 40 that has been adsorbed, and on the structure of the surface (crystal orientation and the like).

The third material 40 is required to have a property of being adsorbed on a target electrode surface so as to promote the surface segregation of the second metal. The atom arrangement and the electronic state in the vicinity of the surface may be changed due to the adsorption of the third material 40 on the surface. The changes may promote the surface segregation of the second metal or may produce the opposite effect. As an example of promoting surface segregation, Physical Review Letters (Vol. 90, page 156101) introduces that it has been observed that dopant atoms in a semiconductor are segregated on the surface due to hydrogen adsorption. Like the above example, an adsorptive material capable of promoting a surface segregation effect is not rare.

In addition, it is important that the third material 40 have another property of being easily removable from the surface after the surface segregation of the second metal is completed. Alternatively, the property is to avoid increasing the contact resistance even if the third material 40 is not removed and is present at the boundary between the organic semiconductor and the electrode. Hydrogen atoms or halogen atoms, for example, can be removed from the surface through a heat treatment to some extent after the surface segregation is promoted. Those atoms can be thus used for such a purpose. When the third material 40 is present on the surface without being removed, it preferably has a property to avoid increasing the contact resistance and actively reduce the contact resistance.

Furthermore, the third material 40 is desirably inexpensive. Also, it is desirable that processes for using the third material 40 be as simple as conceivably possible, and that the manufacturing cost be not significantly increased.

As a material which satisfies the above requirements, there is a self-assembled monolayer formed of a molecular material. When molecular materials are dissolved in a solvent and printed, the molecules are adsorbed on an electrode surface and are self-assembled to produce an array with a certain surface density. This can be implemented for a printing process in a series of processes for forming an organic transistor by printing. Also, there is no need for controlling an alignment, and the material cost is not high. In addition, Physical Review B (Vol. 54, page 14321) discloses that some molecular materials can exhibit properties of reducing a Schottky barrier between an electrode and an organic semiconductor and hence reducing the contact resistance. As molecules forming a material for a self-assembled monolayer film, alkylthiols such as ethanethiol, propanethiol, and butanethiol can be regarded, for example.

FIG. 6B is a cross sectional view showing a state where a monomolecular film 40 is formed by printing on the electrode of the alloy formed on the substrate, as shown in FIG. 6A, and the second metal is segregated on the electrode surface by a heat treatment at an appropriate temperature (50 to 200° C.). This method makes it possible to more easily promote the surface segregation than in the case where the monomolecular film is not added. A molecular material forming the monomolecular film 40 is selected in advance so that it has a property of reducing a Schottky barrier at the boundary between the electrode and the organic semiconductor and a property of promoting the surface segregation of the second metal.

Figure 6C:
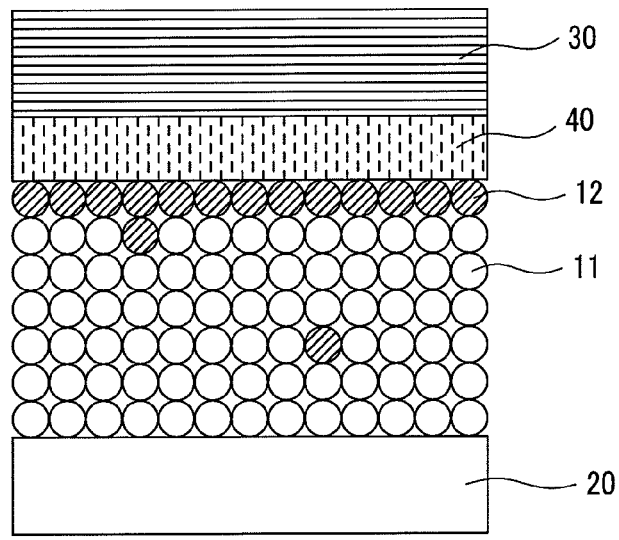
FIG. 6C is a cross sectional view showing a structure in which the organic semiconductor is formed on the monolayer.

FIG. 6C is a cross sectional view showing a state where an organic semiconductor 30 is formed on the monomolecular film 40 which is not removed. In this structure, the contact resistance between the electrode and the organic semiconductor is reduced due to both the thin film of the second metal and the monomolecular film.

With such a structure of the boundary between the electrode and the organic semiconductor, the organic transistor is formed by the subsequent processes similar to those of the first embodiment.

Fourth Embodiment

In a fourth embodiment, the electrode is formed of the first metal, and the thin film of the second metal is formed after the formation of the electrode, without forming a thin metal film covering the electrode surface by surface segregation. Similarly to the first to third embodiments, the copper atoms 11 and the gold atoms 12 will be described below as an example.

Figure 7A:
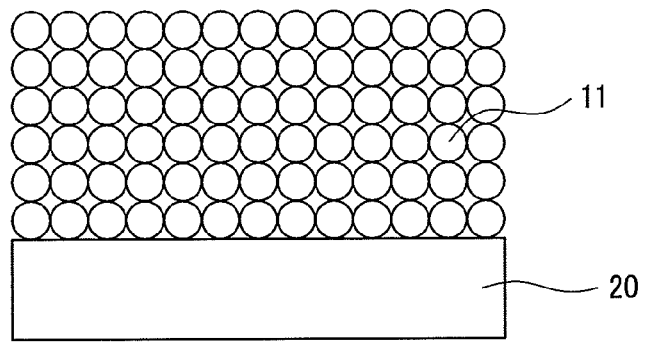
FIG. 7A is a cross sectional view showing an electrode formed of copper atoms on the substrate.

FIG. 7A is a cross sectional view of a structure in which an electrode is formed only of the copper atoms 11 on the substrate 20. Although the method of forming this structure is not limited, the method of printing copper ink formed only of the copper atoms 11 and performing a heat treatment is inexpensive and effective.

Figure 7B:
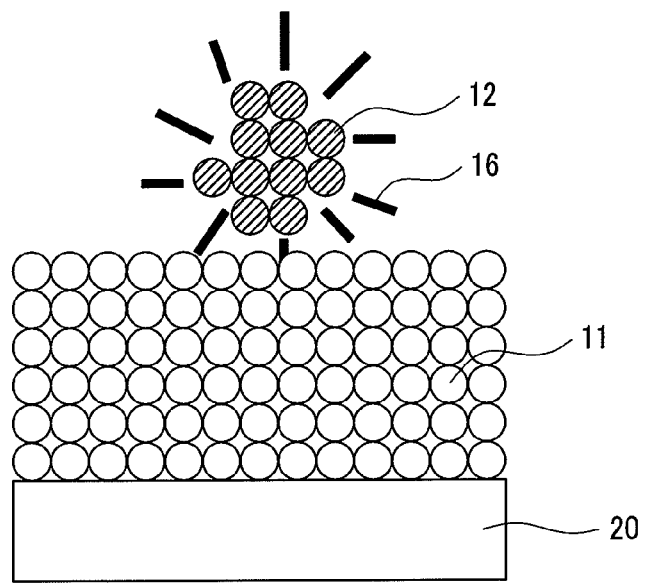
FIG. 7B is a cross sectional view showing a state where the ink of a particle including gold atoms is printed on the electrode formed of the copper atoms and the solvent is evaporated.

FIG. 7B is a cross sectional view of a structure in which ink formed only of the gold atoms 12 is printed on the electrode formed only of the copper atoms 11. In this state, a heat treatment is subsequently performed so as to remove the organic material 16 around the particles of the gold atoms 12.

The gold atoms 12 undergo diffusive motion during the heat treatment. Thus, the gold atoms 12 may be mixed with the copper atoms 11 to a certain extent. However, since the gold atoms 12 are stable on the electrode surface, not all the gold atoms 12 that are placed on the electrode surface before the heat treatment are diffused into the copper electrode. A certain amount of the gold atoms 12 are left on the electrode surface so as to form the thin metal film. During the heat treatment, the gold atoms 12, which have formed particles, are diffused so as to thinly spread on the surface. Thus, the thin film of the gold atoms 12 can be formed.

Figure 7C:
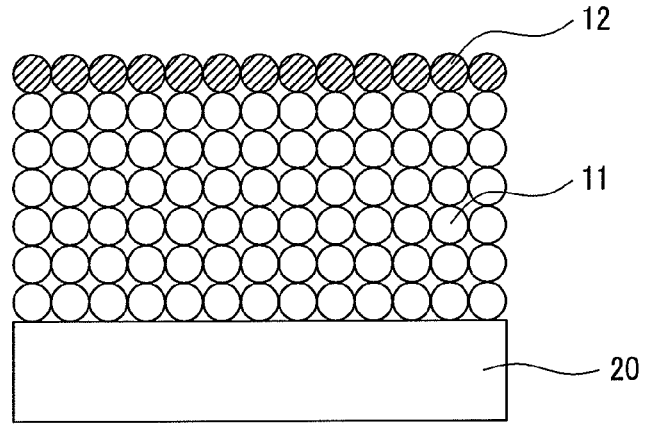
FIG. 7C is a cross sectional view showing a state where a thin film of the gold atoms is formed on the surface of the electrode formed of the copper atoms by a heat treatment.

FIG. 7C is a cross sectional view showing the final structure of the thin metal film covering the electrode surface, according to the fourth embodiment.

In the procedures of the method of the fourth embodiment, after the electrode is formed, the process of forming the thin metal film is required. Thus, the number of processes is increased. However, the heat treatment starts in the state where the gold atoms 12 are placed on the surface of the copper atoms 11 in the fourth embodiment, instead of starting the heat treatment in the state of the alloy in which the gold atoms 12 and the copper atoms 11 are uniformly scattered so as to cause the surface segregation. Thus, distances of movements of the gold atoms 12 are shorter, and the thin metal film can be more effectively formed, as compared with the latter.

Furthermore, in the case of a combination of two types of metal atoms other than gold atoms and copper atoms, even if the second metal are not easily segregated on the surface due to the combination of the two types of the metal atoms, the second metal is first arranged on the first metal, and the electrode can be formed. Thus, there is an advantage in that the thin film formed of the second metal atoms can cover the electrode surface using such a combination of two types of metal atoms. In the case of such a combination of two types of metal, however, it is necessary to pay attention to a temperature and time of the heat treatment so as not to cause excessive diffusion of the metal atoms.

With such a method of forming the electrode, the organic transistor is formed by the subsequent processes similar to those of the first embodiment.

Fifth Embodiment

In a fifth embodiment, the second metal used as a thin film is printed on an electrode formed of the first metal. After that, a heat treatment is performed. Similarly to the first to fourth embodiments, a description will be made of the copper atoms 11 and the gold atoms 12 as an example.

Figure 8A:
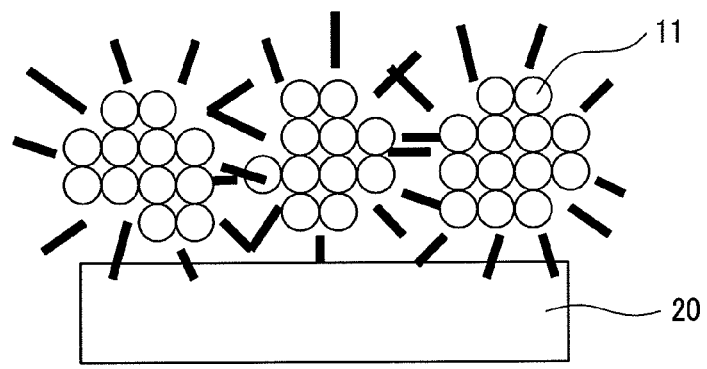
FIG. 8A is a cross sectional view showing a state where the ink of the particles including copper atoms is printed on the substrate and the solvent is evaporated.

FIG. 8A is a view showing a state where ink containing the particles of the copper atoms 11 is printed and a solvent is evaporated.

Figure 8B:
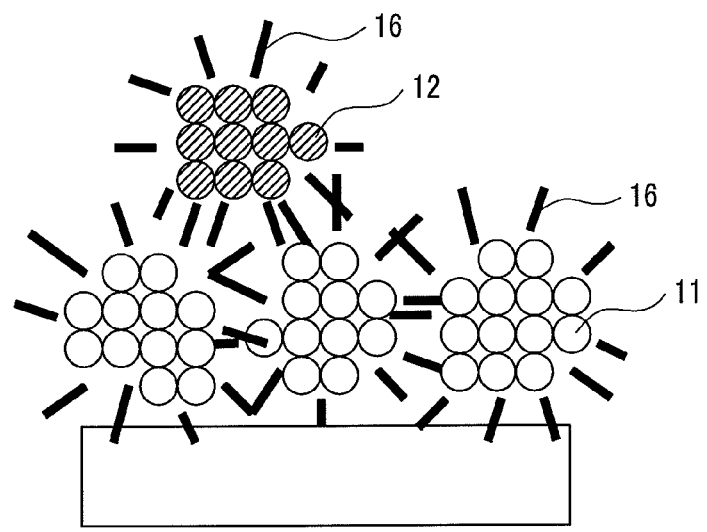
FIG. 8B is a cross sectional view showing a state where the ink of the particles including gold atoms is further printed and the solvent is evaporated.

FIG. 8B is a view showing a state where ink containing the particles of the gold atoms 12 is printed on a layer formed of the particles of the copper atoms 11, and the solvent is evaporated. In this case, it is necessary that the ratio of an amount of the ink containing the particles of the copper atoms 11 to an amount of the ink containing the particles of the gold atoms 12 be approximately proportional to the ratio of an amount of copper to an amount of gold, the copper and the gold both being required for the final electrode structure, as described in the second embodiment. After the printing, a heat treatment is performed so as to remove the organic material 16 around the particles of the copper atoms 11 and the organic material 16 around the particles of the gold atoms 12.

Figure 8C:
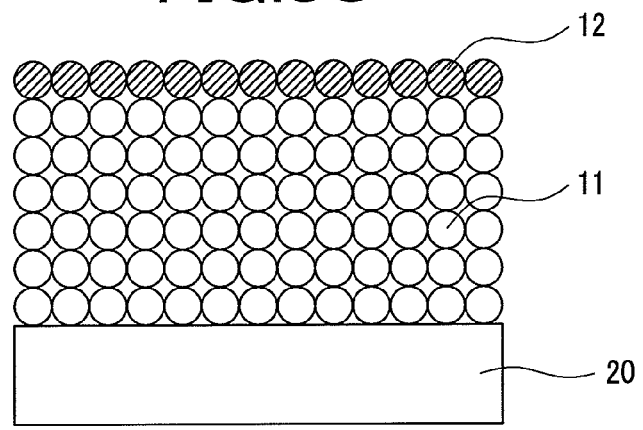
FIG. 8C is a cross sectional view showing a state where the electrode of the copper atoms and a thin film of the gold atoms on the electrode surface are formed by a heat treatment.

FIG. 8C is a view showing an electrode structure formed in the fifth embodiment.

In the fifth embodiment, since the heat treatment is performed once, the number of the processes is reduced, as compared with the following method as described in the fourth embodiment: the heat treatment is performed so as to form the copper electrode, the gold is subsequently printed, and the heat treatment is lastly performed once again. Furthermore, as compared with the method in which the metal ink is completely mixed with the copper ink and the mixed ink is printed, the method in the fifth embodiment is more complicated since two printing processes are required. Before the diffusion occurs due to the heat treatment, however, the copper atoms 11 and the gold atoms 12 are close to the final positions to be reached. Thus, the final electrode structure can be efficiently formed because of the distances to the final positions. In addition, in the case where the thin film of the second metal is only required to cover the electrode surface and not required to cover the entire wiring, the ink of the second metal can be printed only on the electrode surface. This saves the expensive material.

In addition, even when the second metal is not segregated on the surface due to the combination of the first metal and the second metal, since the heat treatment is performed after the second metal is arranged near the surface, the electrode can be formed with the second metal being formed thereon. In such a case where no surface segregation occurs, however, the two types of metal are highly mixed as compared with the case of the fourth embodiment. This results in a decrease in the efficiency of forming the electrode.

With such a method of forming the electrode, the organic transistor is formed by the subsequent processes similar to those of the first embodiment.

Reference numerals shown in the drawings attached hereto are explained as follows:

11 . . . Copper atom
12 . . . Gold atom
16 . . . Organic material used to improve solubility
20 . . . Substrate
30 . . . Organic semiconductor
13 . . . Gate electrode
14 . . . Source electrode
15 . . . Drain electrode
21 . . . insulating material
40 . . . Monomolecular film

What is claimed is:

1. Electrical wiring disposed on an insulating layer, wherein
    the body of the electrical wiring is formed of a first metal; and
    the surface of the first metal is covered with a thin film formed of a second metal, different from the first metal, having a thickness of 0.5 to 5 atom layers, said second metal comprising a material which will decrease contact resistance between the first metal and the insulating layer.

2. The electrical wiring according to claim 1, wherein
    the first metal is any one of Ag, Cu, Fe, Al, or Ni;
    the second metal is any one of Au, W, Pb, Pt, Rh, Pd, Ir, Ru, Os, or Mo; and
    the second metal is segregated on the surface of the first metal in a combination of the first metal with the second metal.

3. An organic transistor comprising:
    a substrate;
    a gate electrode disposed on the substrate;
    an insulating layer disposed so as to cover the gate electrode;
    a source electrode and a drain electrode that are disposed on the insulating layer so as to sandwich the gate electrode; and
    an organic semiconductor disposed so as to cover the source electrode and the drain electrode;
    wherein the bodies of the source electrode and the drain electrode are each formed of a first metal; and
    wherein the surfaces of the bodies of the source electrode and the drain electrode are each covered with a thin film of a second metal, different from the first metal, having a thickness of 0.5 to 5 atom layers, said second metal comprising a material which will decrease contact resistance between the first metal and the organic semiconductor.

4. The organic transistor according to claim 3, wherein
    the first metal is any one of Ag, Cu, Fe, Al, or Ni;
    the second metal is any one of Au, W, Pb, Pt, Rh, Pd, Ir, Ru, Os, or Mo; and
    the second metal is segregated on the surface of the first metal in a combination of the first metal with the second metal.

5. The organic transistor according to claim 3, wherein
    the bodies of the source electrode and the drain electrode are formed of the first metal;
    the surfaces of the bodies of the source electrode and the drain electrode are each covered with the thin film of the second metal having a thickness of 0.5 to 5 atom layers; and
    a self-assembled monolayer film is interposed at a contact portion between the outer surface of the source electrode and the organic semiconductor and at a contact portion between the outer surface of the drain electrode and the organic semiconductor.

6. An organic transistor comprising:
    a substrate;
    a gate electrode disposed on the substrate;
    an insulating layer disposed so as to cover the gate electrode;
    a source electrode and a drain electrode that are disposed on the insulating layer so as to sandwich the gate electrode; and
    an organic semiconductor disposed so as to cover the source electrode and the drain electrode;
    wherein the bodies of the source electrode and the drain electrode are each formed of a first metal; and
    means for decreasing contact resistance between the organic semiconductor and the first metal, said means comprising the surfaces of the bodies of the source electrode and the drain electrode each being covered with a thin film of a second metal, different from the first metal, having a thickness of 0.5 to 5 atom layers and having a lower contact resistance with the organic semiconductor than the contact resistance between the first metal and the organic semiconductor.

7. The organic transistor according to claim 6, wherein
    the first metal is any one of Ag, Cu, Fe, Al, or Ni;
    the second metal is any one of Au, W, Pb, Pt, Rh, Pd, Ir, Ru, Os, or Mo; and
    the second metal is segregated on the surface of the first metal in a combination of the first metal with the second metal.

8. The organic transistor according to claim 7, wherein the bodies of the source electrode and the drain electrode are formed of the first metal;
    the surfaces of the bodies of the source electrode and the drain electrode are each covered with the thin film of the second metal having a thickness of 0.5 to 5 atom layers; and
    a self-assembled monolayer film is interposed at a contact portion between the outer surface of the source electrode and the organic semiconductor and at a contact portion between the outer surface of the drain electrode and the organic semiconductor.

* * * * *